United States Patent
Bi et al.

(10) Patent No.: US 9,941,352 B1
(45) Date of Patent: Apr. 10, 2018

(54) TRANSISTOR WITH IMPROVED AIR SPACER

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/285,728

(22) Filed: Oct. 5, 2016

(51) Int. Cl.
| | |
|---|---|
| *H01L 21/82* | (2006.01) |
| *H01L 29/06* | (2006.01) |
| *H01L 21/764* | (2006.01) |
| *H01L 29/40* | (2006.01) |
| *H01L 21/283* | (2006.01) |
| *H01L 29/78* | (2006.01) |
| *H01L 21/8234* | (2006.01) |

(52) U.S. Cl.
CPC ........ *H01L 29/0649* (2013.01); *H01L 21/283* (2013.01); *H01L 21/764* (2013.01); *H01L 21/823468* (2013.01); *H01L 29/401* (2013.01); *H01L 29/78* (2013.01)

(58) Field of Classification Search
CPC .................................................. H01L 29/4991
See application file for complete search history.

(56) References Cited

U.S. PATENT DOCUMENTS

| | | | |
|---|---|---|---|
| 8,637,384 B2 | 1/2014 | Ando et al. | |
| 8,637,930 B2 | 1/2014 | Ando et al. | |
| 9,159,609 B2 | 10/2015 | Lee et al. | |
| 9,202,932 B2 | 12/2015 | Paek et al. | |
| 9,245,849 B2 | 1/2016 | Park et al. | |
| 9,252,233 B2 | 2/2016 | Hsiao et al. | |
| 9,287,163 B2 | 3/2016 | Kim | |
| 9,293,362 B2 | 3/2016 | Lee et al. | |
| 9,318,382 B2 | 4/2016 | Kim | |
| 9,337,203 B2 | 5/2016 | Hwang et al. | |
| 9,559,184 B2 * | 1/2017 | Ching | H01L 29/6656 |
| 9,627,514 B1 * | 4/2017 | Kim | H01L 21/7682 |
| 2010/0025775 A1 * | 2/2010 | Giles | H01L 23/485 257/386 |
| 2012/0104512 A1 * | 5/2012 | Horak | H01L 29/4983 257/401 |
| 2014/0110798 A1 * | 4/2014 | Cai | H01L 29/78 257/410 |

(Continued)

*Primary Examiner* — Benjamin Sandvik
(74) *Attorney, Agent, or Firm* — Fleit Gibbons Gutman Bongini Bianco PL; Thomas S. Grzesik

(57) ABSTRACT

A semiconductor structure and a method for fabricating the same. The semiconductor structure includes a gate stack disposed on a substrate. A gate contact is disposed in contact with an end portion of the gate stack. An air gap spacer is disposed in contact with a portion of the gate stack. The end portion of the gate stack is absent the air gap spacer. The method includes forming a gate contact in contact with a gate stack. A spacer surrounding at least a portion of the gate stack is removed after the gate contact has been formed. The removal of the spacer forms a trench surrounding the gate stack and stopping at the gate contact. An air gap spacer is formed within the trench.

20 Claims, 11 Drawing Sheets

(56) References Cited

U.S. PATENT DOCUMENTS

| | | | |
|---|---|---|---|
| 2016/0086947 A1* | 3/2016 | Park | H01L 27/092 257/369 |
| 2016/0111515 A1 | 4/2016 | Besser et al. | |
| 2016/0141240 A1 | 5/2016 | Saka et al. | |
| 2016/0163594 A1 | 6/2016 | Kim | |
| 2016/0172304 A1 | 6/2016 | Lee et al. | |
| 2016/0197003 A1 | 7/2016 | Kim | |
| 2016/0225710 A1 | 8/2016 | Hwang et al. | |
| 2017/0076978 A1* | 3/2017 | Cheng | H01L 21/76831 |

* cited by examiner

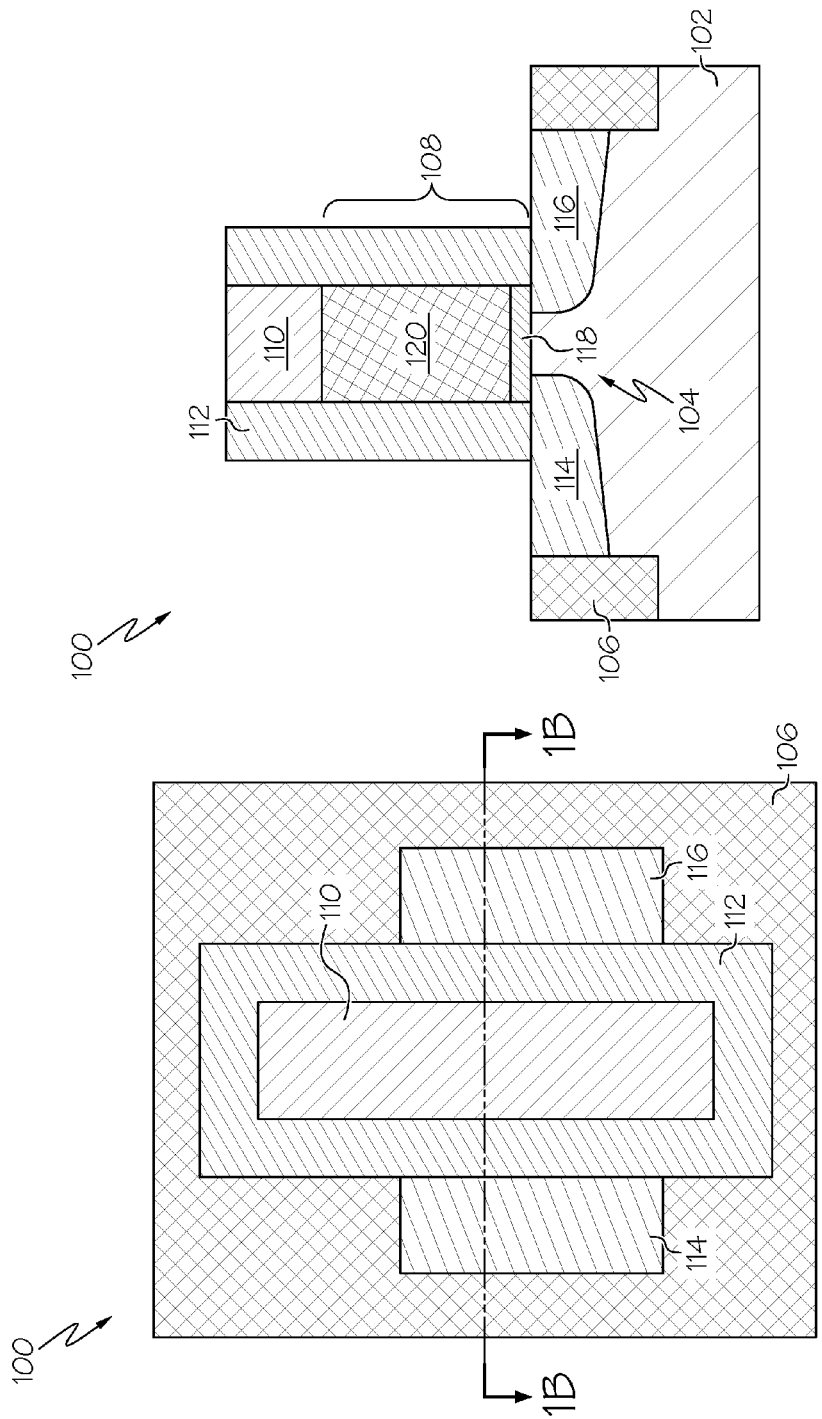

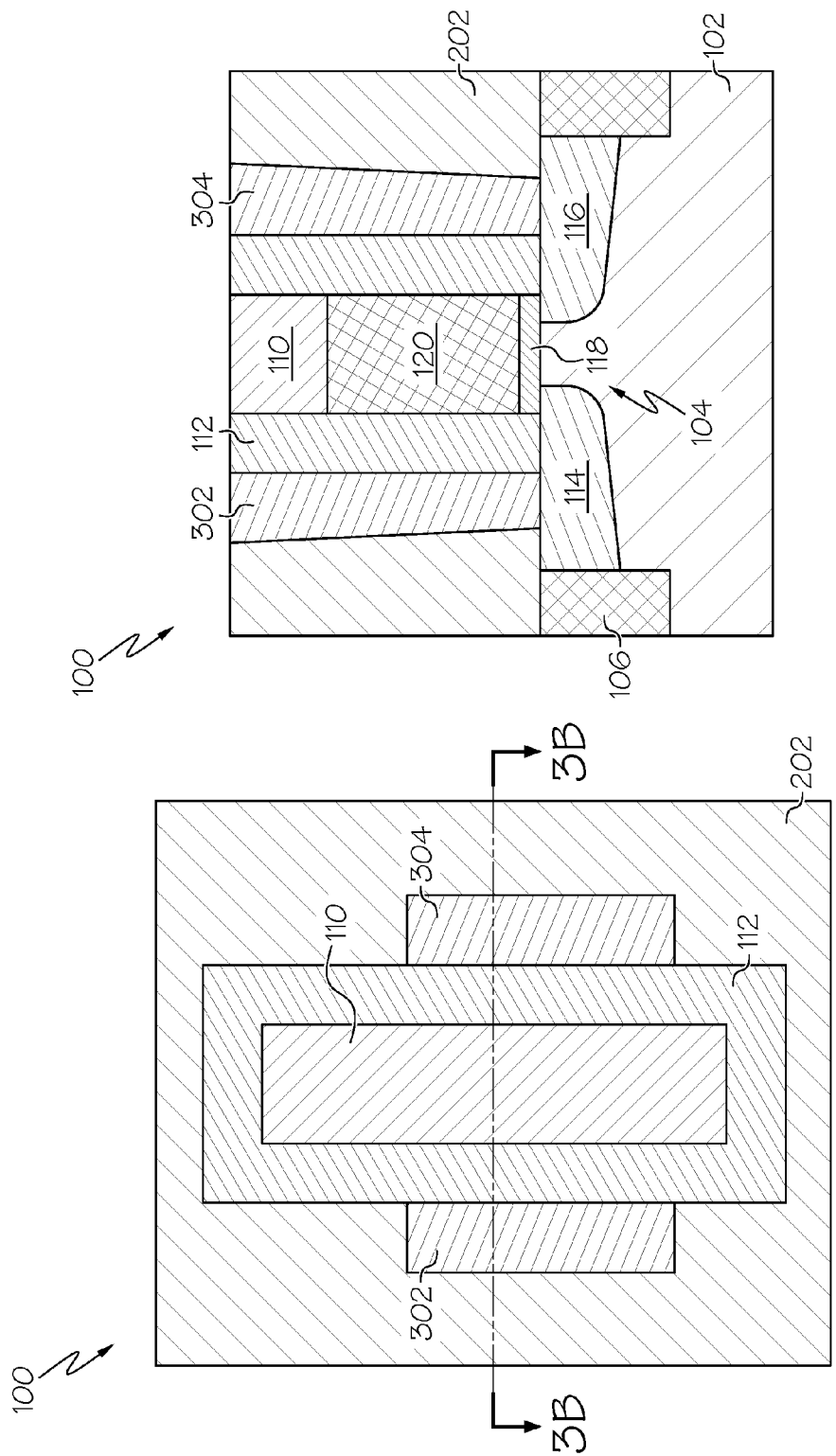

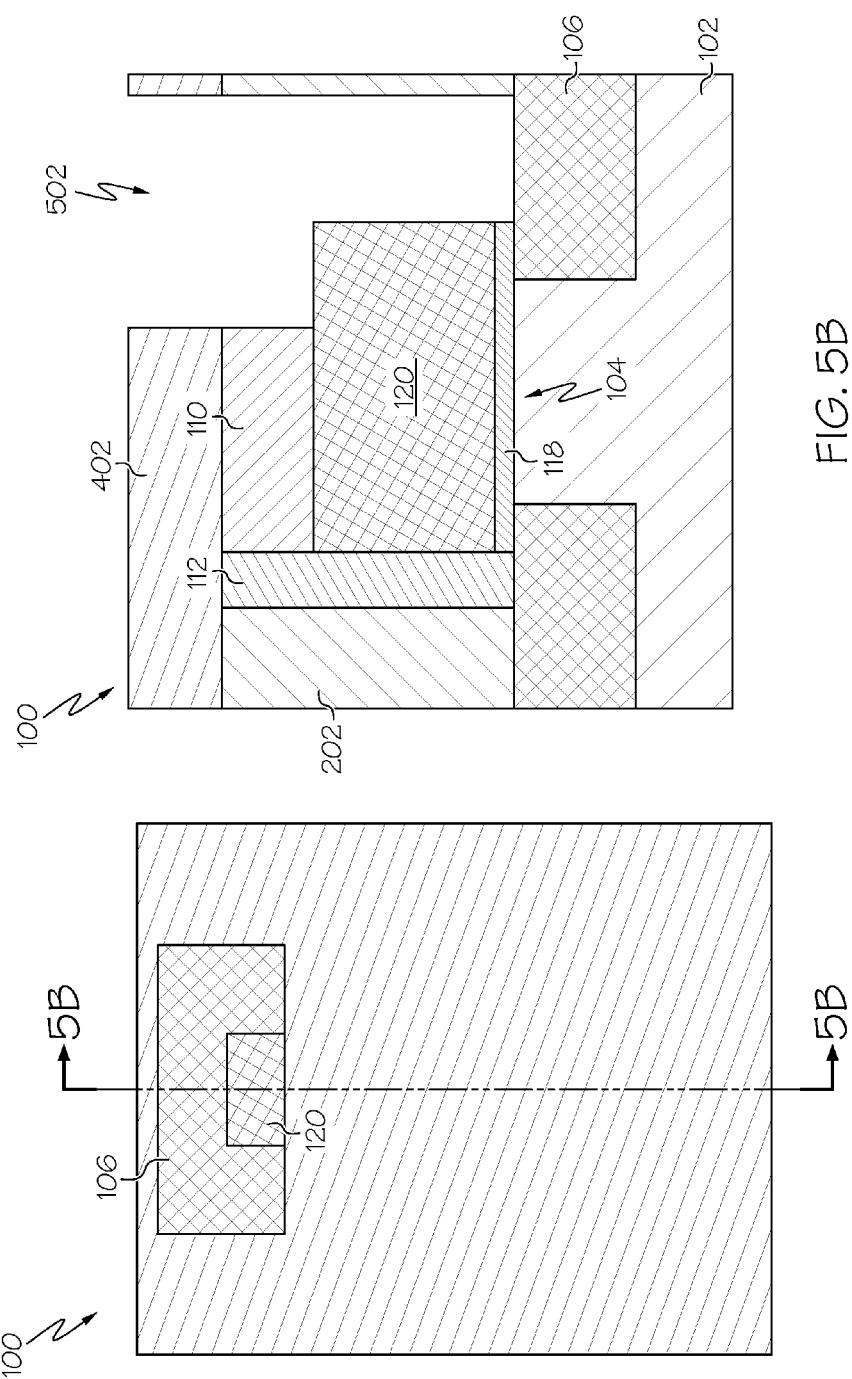

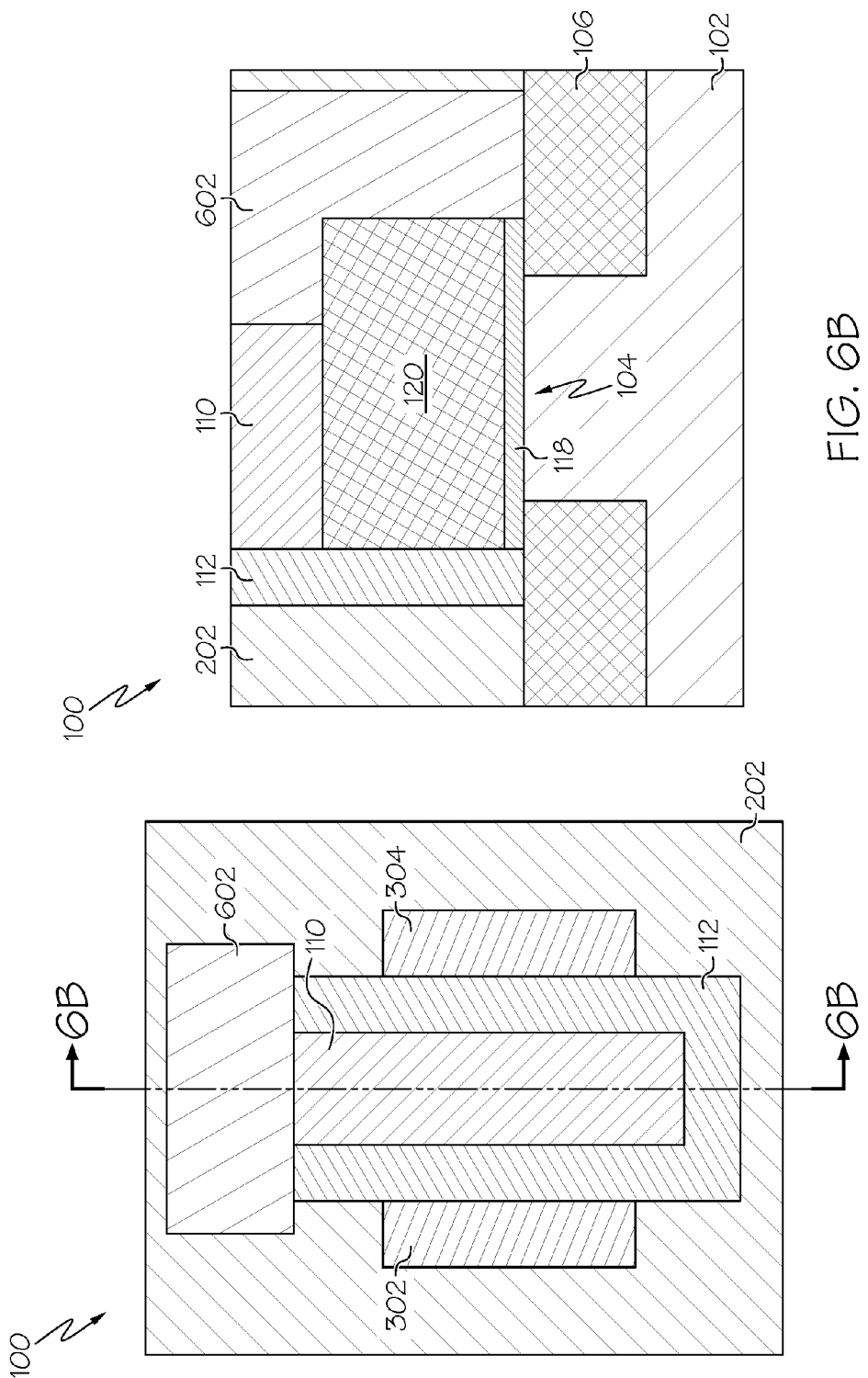

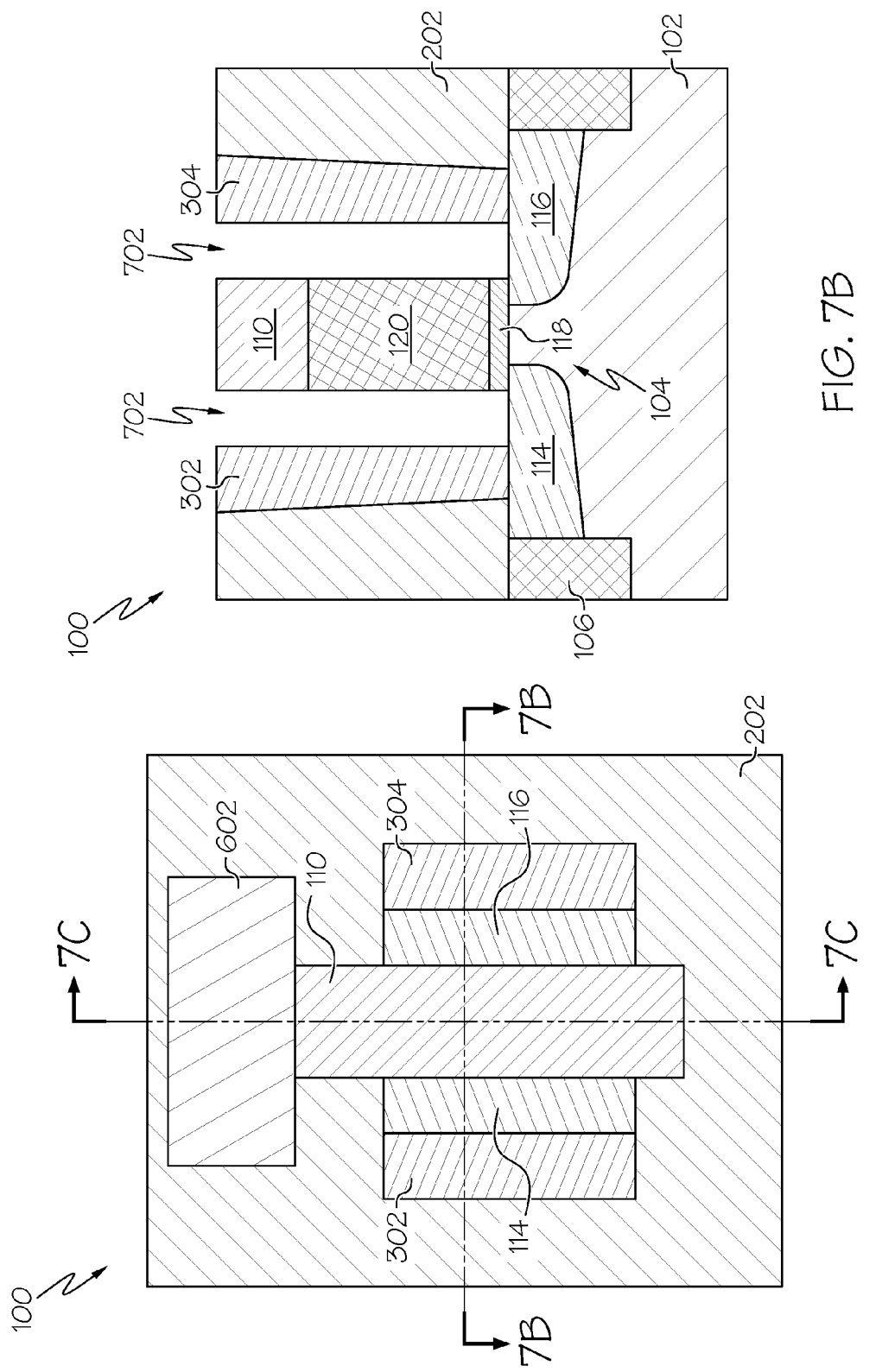

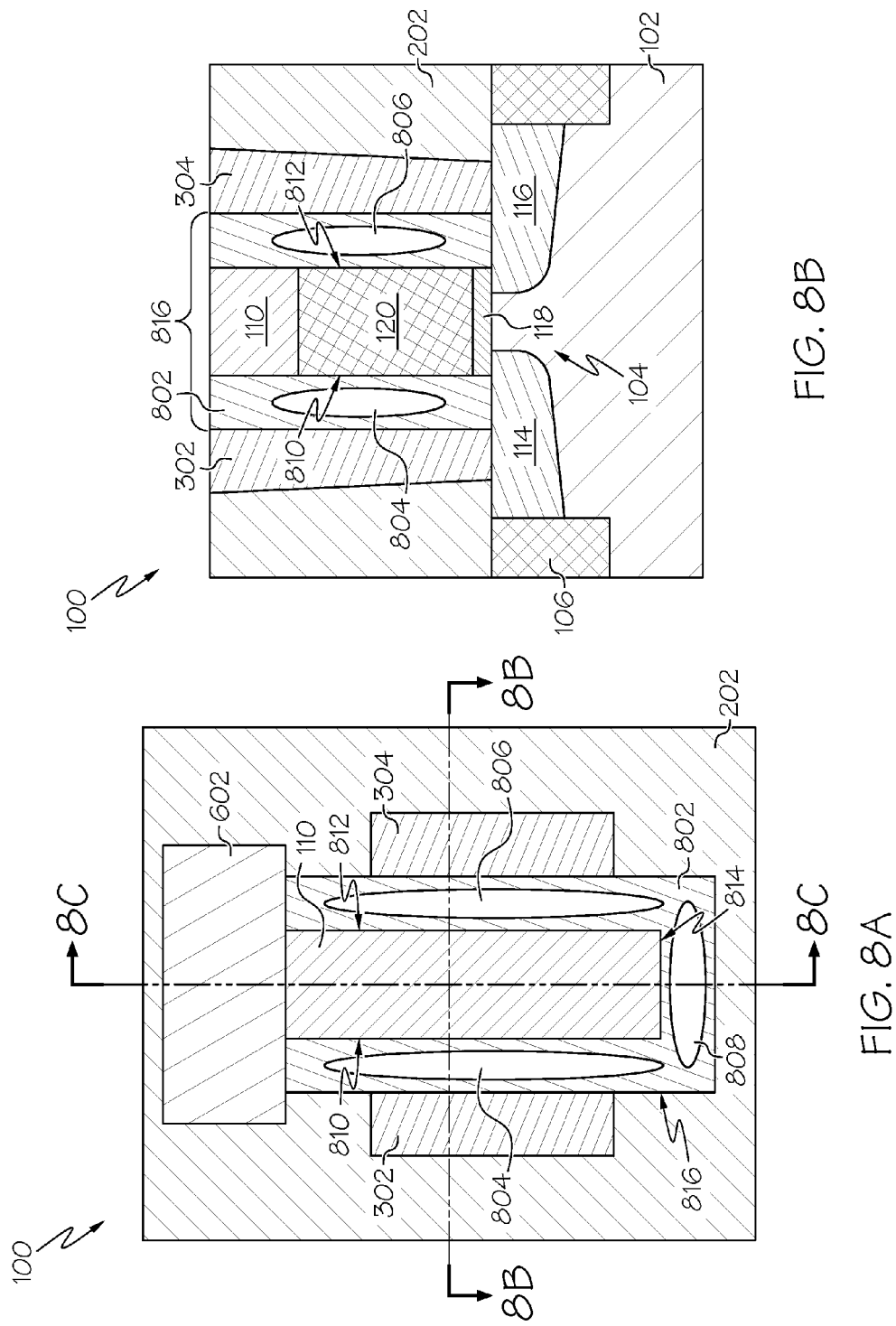

TRANSISTOR WITH IMPROVED AIR SPACER

BACKGROUND OF THE INVENTION

The present invention generally relates to the field of semiconductors, and more particularly relates to air spacers for transistors.

Air gap spacers are useful in reducing parasitic capacitance in highly scaled semiconductor devices. However, conventional fabrication techniques sometimes introduce gate contact metal into the air gap spacer. This results in shorting and reliability issues with the semiconductor device.

SUMMARY OF THE INVENTION

In one embodiment, a method for fabricating a semiconductor structure is provided. The method includes forming a gate contact in contact with a gate stack. A spacer surrounding at least a portion of the gate stack is removed after the gate contact has been formed. The removal of the spacer forms a trench surrounding the gate stack and stopping at the gate contact. An air gap spacer is formed within the trench.

In another embodiment, a semiconductor structure is provided. The semiconductor structure includes a gate stack disposed on a substrate. A gate contact is disposed in contact with an end portion of the gate stack. An air gap spacer is disposed in contact with a portion of the gate stack. The end portion of the gate stack is absent the air gap spacer.

In yet another embodiment, an integrated circuit is provided. The integrated circuit includes a semiconductor structure. The semiconductor structure includes a gate stack disposed on a substrate. A gate contact is disposed in contact with an end portion of the gate stack. An air gap spacer is disposed in contact with a portion of the gate stack. The end portion of the gate stack is absent the air gap spacer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 1A is a top view of an initial semiconductor structure according to one embodiment of the present invention;

FIG. 1B is a cross-sectional view of the initial semiconductor structure according to one embodiment of the present invention;

FIG. 3A is a top view of the semiconductor structure after source and drain contacts have been formed according to one embodiment of the present invention;

FIG. 3B is a cross-sectional view of the initial semiconductor structure after source and drain contacts have been formed according to one embodiment of the present invention;

FIG. 5A is a top view of the semiconductor structure after a gate contact trench has been formed according to one embodiment of the present invention;

FIG. 5B is a cross-sectional view of the initial semiconductor structure after the gate contact trench has been formed according to one embodiment of the present invention;

FIG. 6A is a top view of the semiconductor structure after a gate contact has been formed according to one embodiment of the present invention;

FIG. 6B is a cross-sectional view of the initial semiconductor structure after the gate contact has been formed according to one embodiment of the present invention;

FIG. 7A is a top view of the semiconductor structure after a gate spacer has been formed according to one embodiment of the present invention;

FIG. 7B is a cross-sectional view of the initial semiconductor structure after the gate spacer has been formed according to one embodiment of the present invention;

FIG. 8A is a top view of the semiconductor structure after an air gap spacer has been formed according to one embodiment of the present invention;

FIG. 8B is a cross-sectional view of the initial semiconductor structure after the air gap spacer has been formed according to one embodiment of the present invention;

DETAILED DESCRIPTION

Figures 2A, 2B:
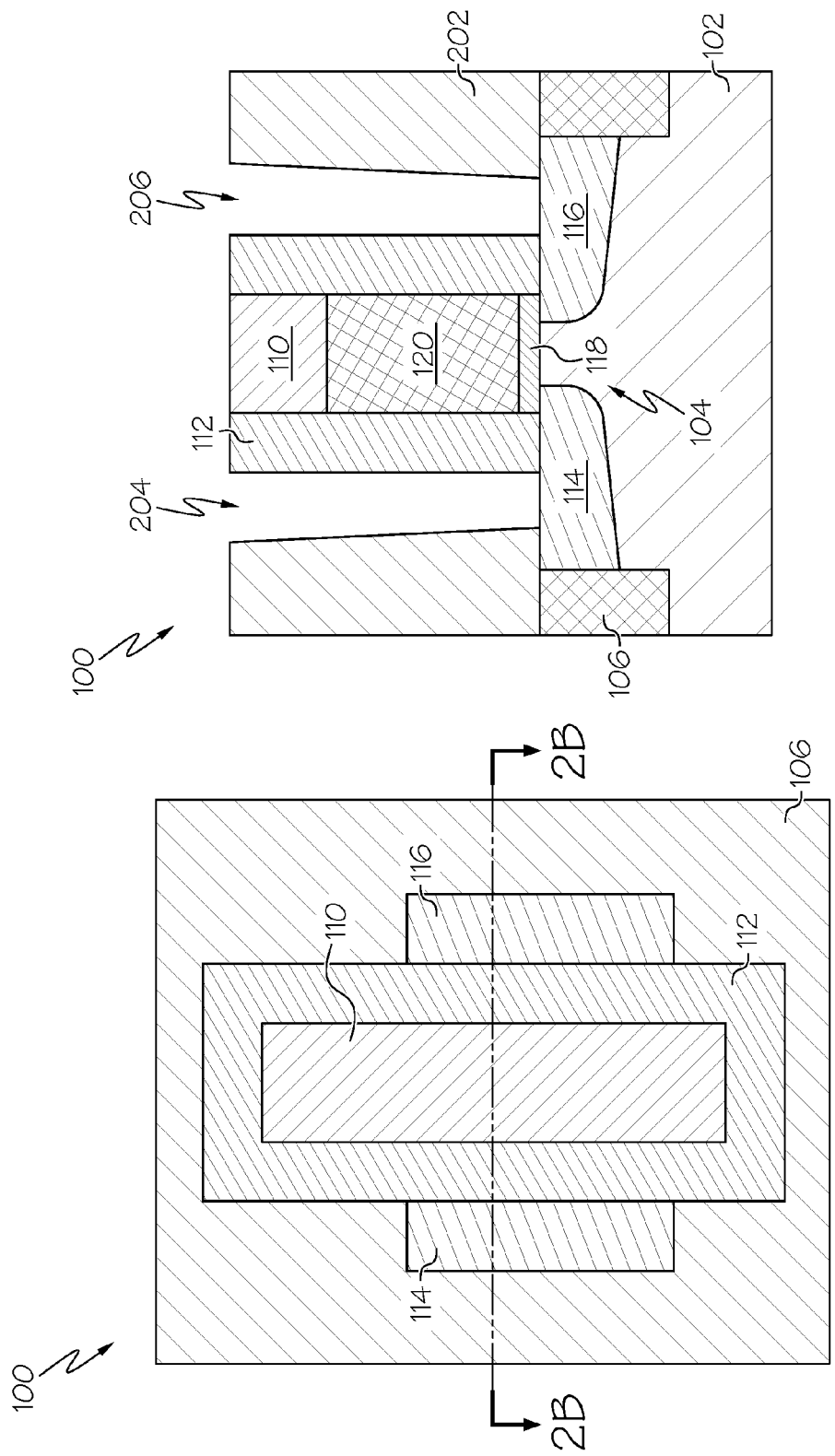
FIG. 2A is a top view of the semiconductor structure after contact trenches have been formed therein according to one embodiment of the present invention.
FIG. 2B is a cross-sectional view of the initial semiconductor structure after contact trenches have been formed therein according to one embodiment of the present invention.

It is to be understood that the present invention will be described in terms of a given illustrative architecture; however, other architectures, structures, substrate materials and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-8 illustrate various processes for fabricating semiconductor devices having air spacers. In general, the figures include various top views and cross-sectional views that are taken where indicated in the top views. More specifically, the view "A" is a cross-sectional view taken along a line that passes through a gate stack, while view "B" is a cross-section view that is taken transverse to the long axis of the gate stack.

FIGS. 1A and 1B show a cross-section of a semiconductor structure 100 at a starting point for embodiments of the present invention. The semiconductor structure 100 of FIGS. 1A and 1B is a field-effect-transistor (FET) that includes a substrate 102, an active area 104, isolation region 106, a gate stack 108, gate cap/mask 110, a sacrificial spacer 112, a source 114, and a drain 116. In one embodiment, the substrate 102 is comprised entirely of a semiconductor material. In other embodiments, the substrate 102 is semiconductor-on-insulator (SOI) substrate comprising a handle substrate and an insulator layer. The substrate 102, in one embodiment, includes a single crystalline semiconductor material or a polycrystalline material. In another embodiment, the substrate 102 includes an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

In yet another embodiment, the substrate 102 includes a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In a further embodiment, the semiconductor device layer 102 includes undoped single crystalline silicon or single crystalline silicon doped with p-type dopant atoms or n-type dopant atoms. Examples of materials for the semiconductor device layer 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

In one embodiment, the active area 104 for the FET is defined within the substrate 102 (or an additional semiconductor layer) through pad-film deposition, patterning (e.g., by photolithography), and reactive-ion etching (RIE). For example, a pad oxide having a thickness of 2 nm to 10 nm is formed in an oxidation furnace, and a pad nitride is deposited over the pad oxide using low-pressure chemical vapor deposition (LPCVD) or rapid-thermal chemical vapor deposition (RTCVD). Photolithography and a nitride-oxide-silicon RIE are then performed to define the active area 104. Although shown in the figure that the channel under the gate in the active area 104 is a planar channel, the active area can include other structures such as fins, nanowires, nanosheets, carbon nanotube, or 2D material such as graphene, etc. The semiconductor device can be a planar transistor, a FinFET, a nanowire transistor, a nanosheet transistor, a carbon nanotube, a graphene transistor, and/or the like.

The isolation region 106 isolates the active area 104. In one embodiment, the isolation region 106 is formed through shallow trench isolation (STI). In this embodiment, STI is obtained through deposition of an STI oxide, densification anneals, and chemical-mechanical polishing (CMP) that stops on the pad nitride. For example, shallow trench isolation structures can be formed by trenches extending from the top surface of the substrate 102 (or an additional semiconductor layer) down into the substrate 102, filling the trenches with a dielectric material, and removing excess dielectric material from above the top surface of the substrate 102. The isolation region 106 is continuous around the active area 104. Any excess materials such as pad nitride, pad oxide, and STI oxide are removed (e.g., through wet etching using hot phosphoric acid and HF).

The gate stack 108, in one embodiment, includes a dielectric layer 118 formed on and in contact with the active area 104 by, for example, chemical vapor deposition (CVD) processes, thermal oxidation, or wet chemical oxidation. In embodiments, the dielectric layer 118 can be any suitable dielectric layer such as, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum, aluminum. The gate stack 108 also includes a conductive gate 120 formed on and in contact with the dielectric layer 118. The conductive gate 120, in one embodiment, includes a conductor material such as doped polycrystalline or doped amorphous silicon, doped germanium, doped silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material can further include dopants that are incorporated during or after deposition. The conductive material can include multiple layers such as gate work function setting layer (work function metal) and gate conductive layer.

The gate stack 108 can be formed using various different processes. One such process is a replacement conductive gate (RMG) process. In this process, a replacement (or dummy) gate structure is then formed on the active area 104 of the FET. The dielectric layer 118 is formed on the active area 104 by, for example, chemical vapor deposition (CVD) processes, thermal oxidation, or wet chemical oxidation. A polysilicon layer or any other disposable material such as amorphous silicon is then formed on and in contact with the dielectric layer 118 using a deposition process such as CVD. This replacement gate stack acts as a place holder for the actual gate stack to be formed after the sacrificial spacer 112 is formed. A hard mask is formed on and in contact with the polysilicon layer using, for example a CVD process. The hard mask can comprise oxide, nitride, silicon nitride, and/or the like.

The sacrificial gate spacer 112 is then formed on and in contact with the sidewalls of the replacement gate stack comprising the dielectric layer 118, polysilicon layer, and the hard mask. In one embodiment, the sacrificial gate spacer 112 includes a dielectric material (such as silicon oxide, silicon nitride, silicon oxynitride, or a combination of these). In this embodiment, the dielectric material is formed and then reactive-ion etching is used to remove the dielectric material except from the sidewalls of the replacement gate stack. It should be noted that the replacement gate stack and sacrificial gate spacer 112 can be formed prior to or after forming the isolation region 106. Once the replacement gate stack and sacrificial gate spacer 112 have been formed, the source and drain regions 114, 116 (extension regions) are formed within the substrate 102 (or additional semiconductor layer).

In one embodiment, the source and drain regions 114, 116 (extension regions) are formed by introducing electrical dopants such as boron (B), gallium (Ga), indium (In), phosphorous (P), arsenic (As), and/or antimony (Sb) by ion implantation, plasma doping, gas phase doping, and/or in-situ doped epitaxy, employing various masking structures as known in the art. In one embodiment, a thermal anneal (for example, rapid thermal anneal, laser anneal, flash anneal, or any suitable combination of those techniques) can be performed to activate and diffuse the incorporated ions to form the source and drain regions 114, 116 (extension regions), such as through a spike rapid-thermal anneal (RTA). The hardmask and disposable polysilicon layer of the replacement structure are then removed via a selective etch, and material for the conductive gate 120 is deposited and etched/polished. The gate cap 110 is then formed on and in contact with the gate 108 using, for example a CVD process. The gate cap 110, in one embodiment, includes oxide, nitride, silicon nitride, SiBCN, SiOCN, SiCN, SiCH, and/or the like.

It should be noted that embodiments of the present invention are not limited to the RMG process discussed above. For example, other processes such as a gate-first process can be performed to create gate stack 108 and sacrificial spacer 112. A gate-first process forms a dielectric layer in contact with the substrate 102, and a conductive gate layer in contact with the dielectric layer. Patterning and etching processes are then performed to form the gate stack 108. A spacer material is then deposited and reactive-ion etching is performed to form the sacrificial spacer 112. It should also be noted that embodiments of the invention are not limited to a single transistor device as shown in FIG. 1.

After the structure of FIG. 1 has been formed, an inter-level dielectric (ILD) 202 is deposited over the structure and polished/planarized, as shown in FIGS. 2A and 2B. The CMP process stops at a top surface of the spacer 112 and gate cap 110. The ILD 202, in one embodiment, comprises silicon oxide, silicon nitride, silicon oxynitride, SiC, SiCO, SiCOH, and/or SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the ILD 202 include any of the aforementioned materials in porous form, or in a form that changes during processing to or from being porous and/or permeable to being non-porous and/or non-permeable.

FIGS. 2A and 2B further show that contact trenches 204, 206 are formed within the ILD 202. The contact trenches 204, 206 expose a top surface of a portion of the source 114 and drain 116, and expose sidewalls of the spacer 112. In one embodiment, the trenches 204, 206 are formed by forming a trench etch mask layer over the ILD 202. A photoresist layer is then applied over the trench etch mask layer, and lithographically patterned to form openings therein. The locations of the openings are selected to correspond to the locations of where the contact trenches 204, 206 are to be subsequently formed through. This process leaves unmasked first and second regions of the trench etch mask layer. The pattern in the photoresist layer can be transferred into the trench etch mask layer by an anisotropic etch. The resulting mask layer pattern is transferred into the semiconductor structure 100 by an anisotropic etch that employs the trench etch mask layer as an etch mask resulting in formation of the contact trenches 204, 206.

A source contact 302 and a drain contact 304 are then formed, as shown in FIG. 3. The source contact is formed on and in contact with the portion of the source 114 and the sidewall of the spacer 112 exposed by the contact trench 204. The drain contact 304 is formed on and in contact with the portion of the drain 116 and the sidewall of the spacer 112 exposed by the contact trench 206. The source and drain contacts 302, 304, in one embodiment, are formed by depositing one or more contact metal/metallic materials over the entire structure to fill the contact trenches 204, 206. The contact metal is deposited using, for example, chemical vapor deposition (CVD), physical vapor deposition (PVD), atomic layer deposition (ALD), or any combination thereof. The contact metal material, in one embodiment, includes tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. In one embodiment, the contact trenches are filled by depositing a titanium nitride liner on the trench sidewalls and then filing the trench with tungsten or cobalt. However, other materials are applicable as well. A planarization/polishing process such as CMP is then performed to remove excess contact metal material above a top surface of the ILD 202, spacer 112, and gate cap 110.

Figures 4A, 4B:
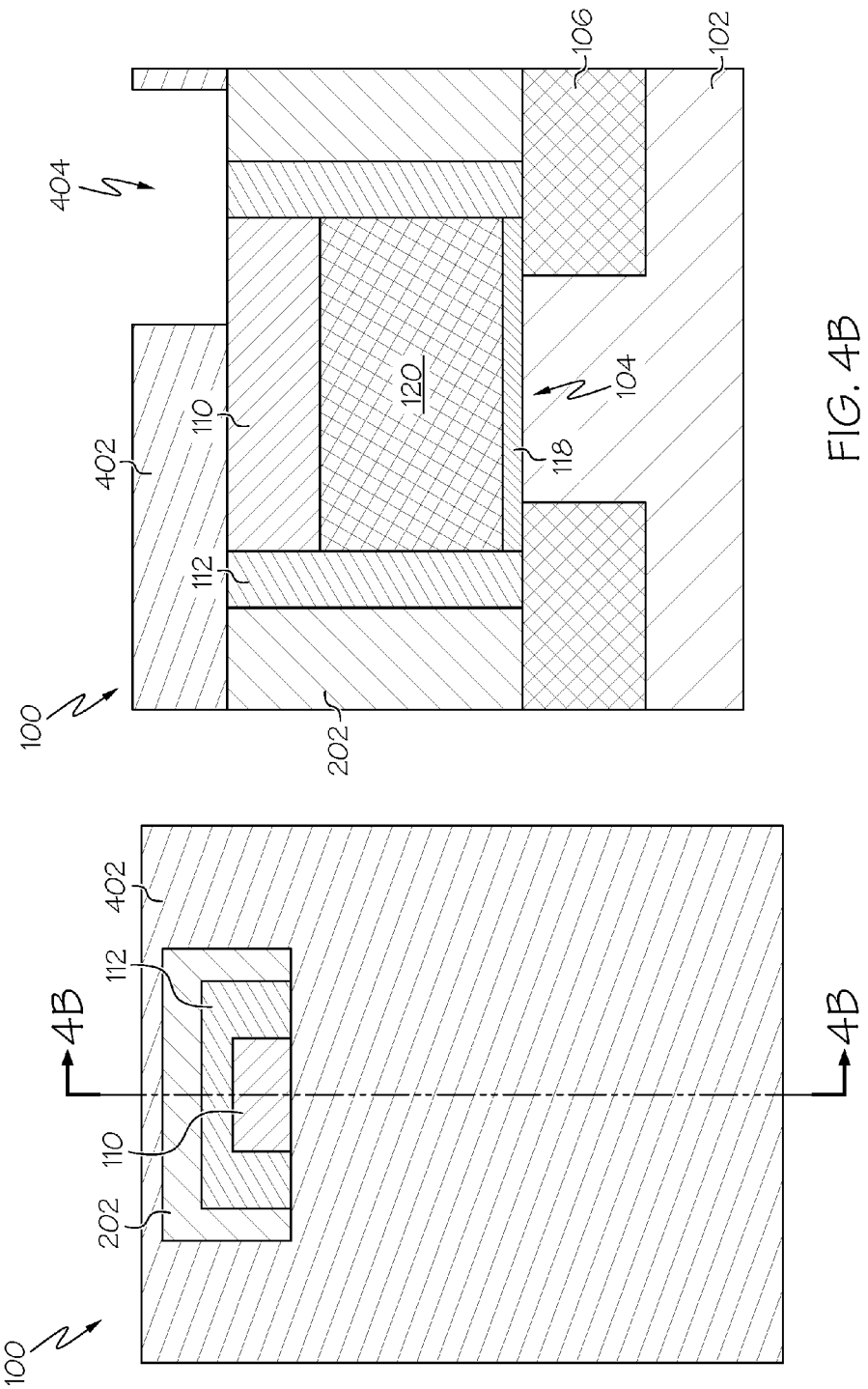
FIG. 4A is a top view of the semiconductor structure after a gate contact etch mask has been patterned according to one embodiment of the present invention.
FIG. 4B is a cross-sectional view of the initial semiconductor structure after the gate contact etch mask has been patterned according to one embodiment of the present invention.

After the source and drain contacts 302, 304 have been formed, a gate contact mask 402 is formed over the structure 100, as shown in FIGS. 4A and 4B. The gate contact mask 402, in one embodiment, includes The mask layer 402 can include a single material or multiple layers of materials; for example, the mask layer 402 can be a softmask such as photoresist, a hardmask such as titanium nitride or silicon nitride, or a combination of hardmask and softmask. FIGS. 4A and 4B also show that an opening/trench 404 is formed within a portion of the gate contact mask 402. The opening 404 exposes a top surface of a portion of the gate cap 110, spacer 112, and ILD 202. The opening 404, in one embodiment, is formed by applying photoresist layer over the gate contact mask 402, and lithographically patterning the resist layer to form an opening therein. The pattern in the photoresist layer is then transferred into the gate contact mask 402 by an anisotropic etch.

The exposed portions of the gate cap 110, spacer 112, and ILD 202 are then removed, as shown in FIGS. 5A and 5B. For example, one or more selective etching processes such as RIE are performed to remove the exposed and underlying portions of the gate cap 110, spacer 112, ILD 202, and dielectric layer 118 selective to the conductive gate 120 and the isolation regions 106. The etch process, in one embodiment is a single etching process. However, in other embodiments, multiple etching processes are used to etch the spacer 112, the gate cap 110, and the exposed portion of the ILD 202 in various sequences. The etch process(es) is a dry etch, wet etch, or a combination of dry etch and wet etch. This process forms a gate contact trench 502 exposing a portion of the top surface of the conductive gate 120 and isolation region 106, and sidewalls of the of the conductive gate 120, dielectric layer 118, and the ILD 202.

A conductive gate contact 602 is then formed within the gate contact trench 502. The gate contact 602 contacts the exposed portion of the top surface of the conductive gate 120 and isolation region 106, and further contacts the exposed sidewalls of the of the conductive gate 120. The gate contact 602 wraps around the exposed portions of the conductive gate 120 at one end 604 of the gate 120. This configuration provides for a larger contact area to the gate resulting in decreased contact resistance, which improves performances of the device.

In one embodiment, the gate contact 602 is formed by depositing a fill metal within the gate contact trench 502 using any suitable technique, such as, for example: ALD, molecular layer deposition (MLD), CVD, in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. After formation of the gate contact 602, a planarization process such as CMP is performed to remove any the gate contact mask 402 and gate contact material above a top surface of the gate cap 110, remaining portion of the spacer 112, and ILD 202. The contact metal material, in one embodiment, includes tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. In one embodiment, the contact trench is filled by depositing a titanium nitride liner on the trench sidewalls and then filing the trench with tungsten or cobalt. However, other materials are applicable as well.

Figure 7C:
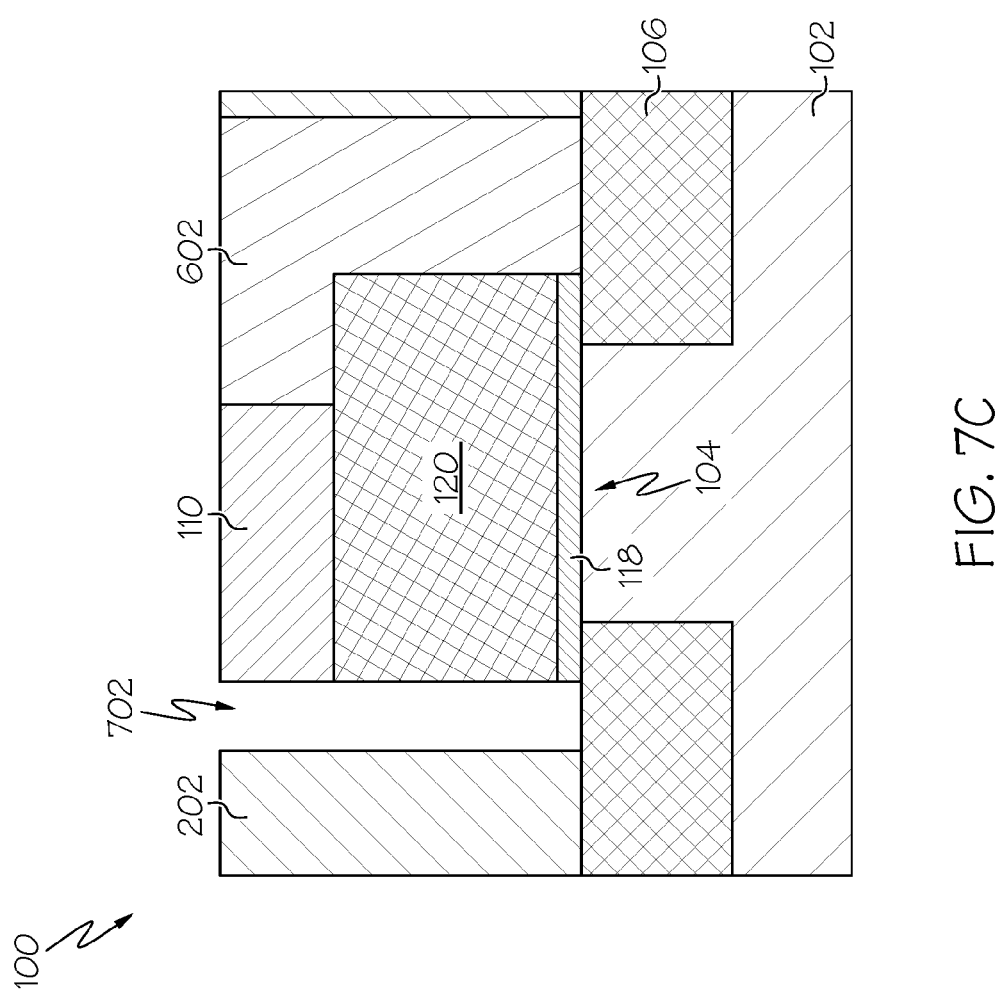
FIG. 7C is another cross-sectional view of the initial semiconductor structure after the gate spacer has been formed according to one embodiment of the present invention.

After the gate contact 602 has been formed, a selective etching process is performed to etch the remaining portions of the sacrificial spacer 112 selective to conductive gate 120, as shown in FIGS. 7A-7C. The etching process is dependent upon the composition of the sacrificial spacer 112. For example, if the sacrificial spacer 112 comprises is silicon nitride then a carbon fluoride based dry etch or plasma etch can used to remove the silicon nitiride selective to the conductive gate 120. However, other selective wet/dry etching processes are applicable as well. The etching process removes the remaining portions of the sacrificial spacer 112 creating a trench 702 around the conductive gate stopping at the gate contact 602. The trench 702 exposes sidewalls of the gate cap 110, high-h dielectric layer 118, conductive gate 120, and source/drain contacts 302, 304. The trench 702 also exposes a top surface of a portion of the source/drains 114, 116.

Figure 8C:
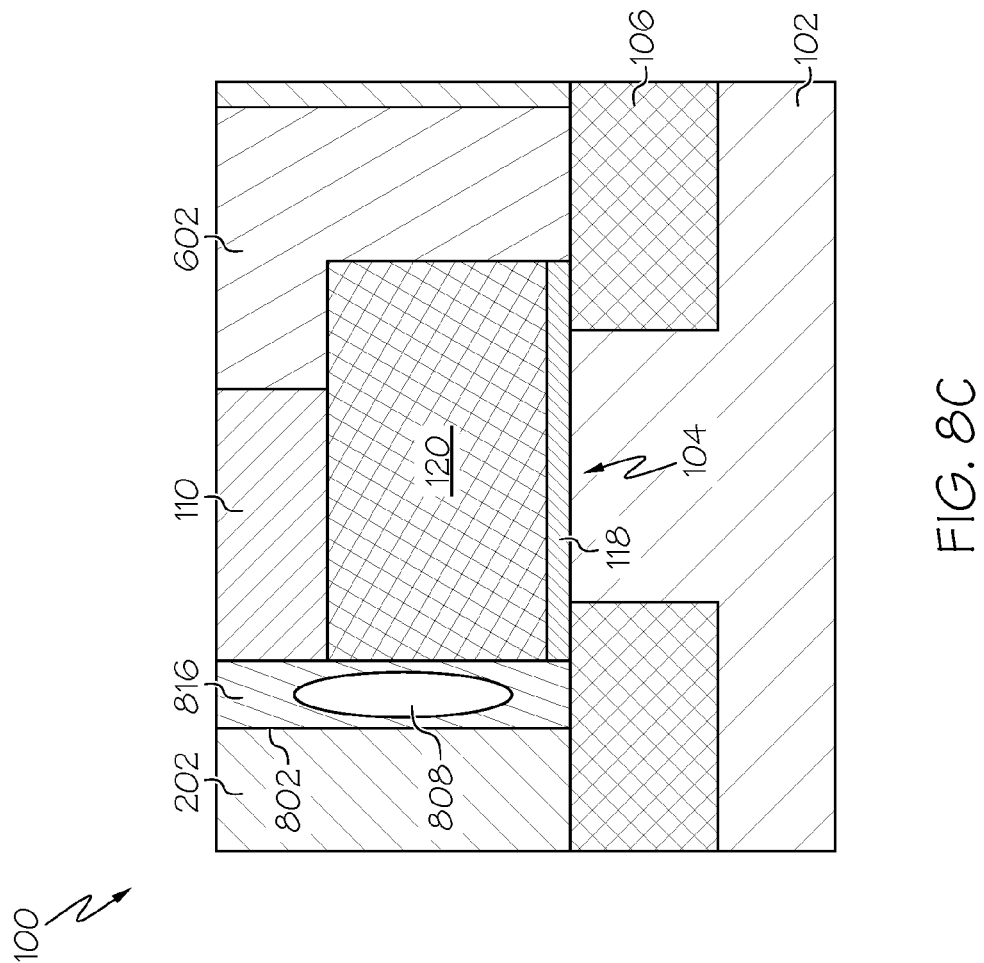
FIG. 8C is another cross-sectional view of the initial semiconductor structure after the air gap spacer has been formed according to one embodiment of the present invention.

A dielectric material 802 is then deposited within the trench 702 via a non-conformal deposition process such as CVD or PECVD, as shown in FIGS. 8A-8C. The dielectric material 802, in one embodiment, comprises silicon oxide, silicon nitride, silicon oxynitride, SiBCN, SiOCN, SiOC, SiCN, SiCH, SiOCH, or a combination of these, or any other dielectric material suitable for a spacer. The non-conformal aspect of the deposition process creates air gaps 804, 806, 808 adjacent to each sidewall 810, 812, 814 of the gate stack and cap layer 104 in contact with the dielectric material 802. The non-conformal deposition process deposits more material at the top of the trench 702 than at the bottom of the trench 702, thereby by pinching of the air gaps 804, 806, 808. In other words, the dielectric material 802 surrounds the air gaps 804, 806, 808. The dielectric material 802 and the air gaps 804, 806, 808 form an air gap spacer 816. As shown in FIGS. 8A-8C, the air gap spacer 816 is formed only in the regions of the structure 100 that are absent the gate contact 602.

The air gap spacer 816 is advantageous because it reduces the parasitic capacitance for highly scaled MOS transistors. In addition, since the gate contact 602 is formed prior to forming the air gap spacer 816 metal does not enter the air gap spacer during contact formation, thereby avoiding shorting and reliability issues. After the air gap spacer 816 has been formed, conventional fabrication processes are then performed to complete the device.

Figure 9:
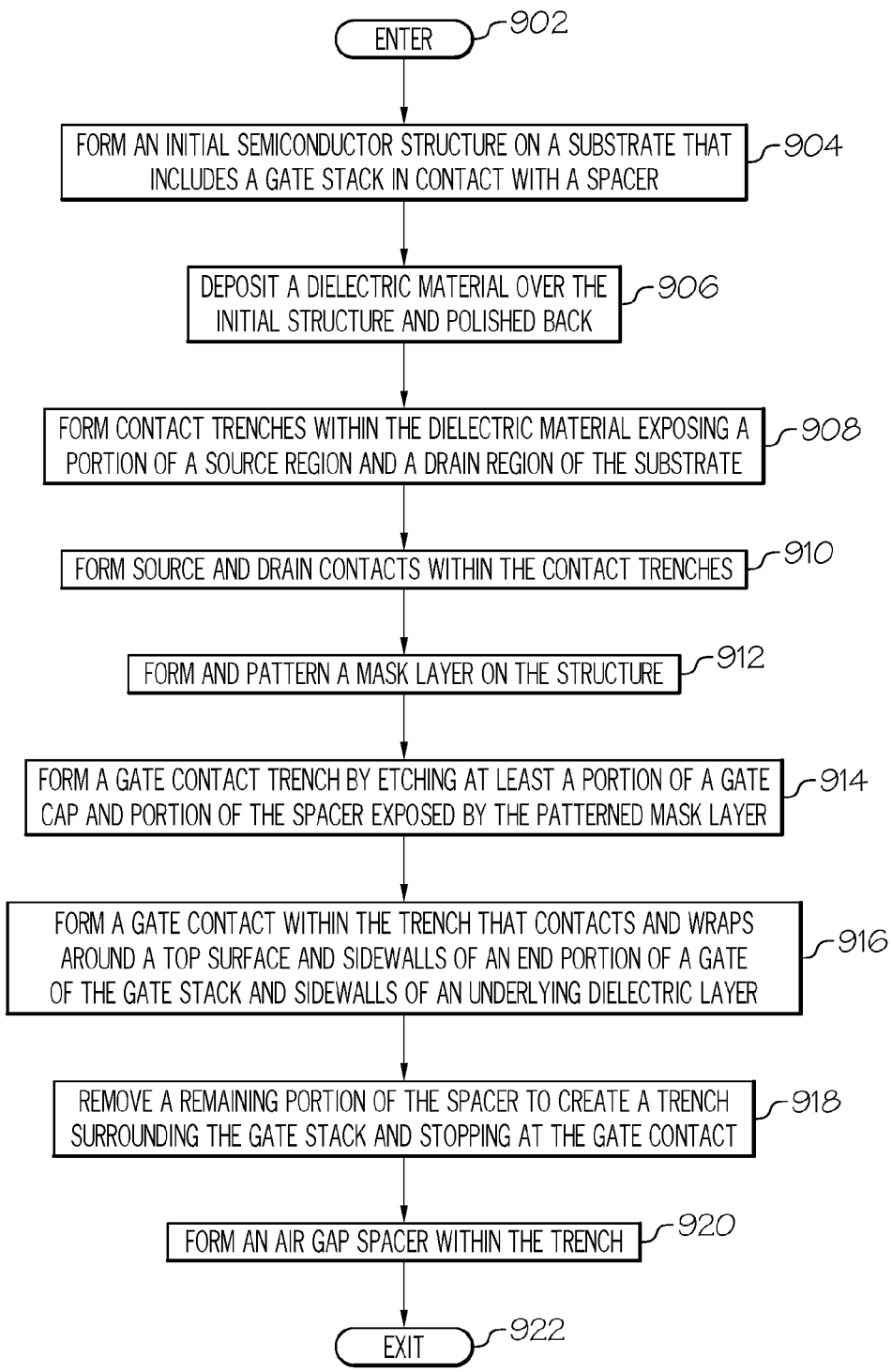
FIG. 9 is an operational flow diagram illustrating one process for fabricating a semiconductor structure according to one embodiment of the present invention.

FIG. 9 is an operational flow diagram illustrating one process for fabricating a semiconductor structure. In FIG. 9, the operational flow diagram begins at step 902 and flows directly to step 904. An initial semiconductor structure, at step 904, is formed on a substrate that includes a gate stack in contact with a spacer. The gate stack includes a gate disposed on and in contact with a dielectric layer. A gate cap is disposed on and in contact with the gate. A dielectric material, at step 906, is deposited over the initial structure and polished back. Content trenches, at step 908, at formed within the dielectric material exposing a portion of a source region and a drain region of the substrate.

Source and drain contacts, at step 910, are formed within the contact trenches. A mask layer, at step 912, is formed on the structure and patterned to expose a portion of the gate cap, a portion of the spacer, and a portion of the dielectric material. A gate contact trench, at step 914, is formed by etching the exposed portions of the gate cap, the spacer, the dielectric material. The gate contact trench exposes an end portion of the gate stack. For example, a portion of a top surface of the gate, sidewalls of the conductive gate, and sidewalls of the dielectric layer at an end portion of the gate stack are exposed. The gate contact trench further exposes sidewalls of the dielectric material and a portion of a top surface of an isolation region formed within the substrate.

A gate contact, at step 916, is formed within the gate contact trench. The gate contact being disposed in contact with the exposed portion of the top surface of the gate, the exposed sidewalls of the gate, the exposed sidewalls of the dielectric layer, the exposed sidewalls of the dielectric material, and the portion of the top surface of the isolation region. The gate contact wraps around an end portion of the gate and dielectric layer. The remaining portion of the spacer, at step 918, is removed forming a trench surrounding the gate stack and stopping at the gate contact. The trench exposes a top surface of a portion of the source region, drain region, and isolation region. An air gap spacer, at step 920, is formed within the trench via a non-conformal deposition of an insulating material. The non-conformal deposition forms air gaps adjacent to each sidewall of the gate stack and cap layer 104 in contact with the deposited insulating material. The non-conformal deposition process deposits more material at the top of the trench than at the bottom of the trench, there pinching of the air gaps. In other words, the dielectric material surrounds the air gaps. The control flow then exits at step 922.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention can be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements can apply to some inventive features but not to others.

What is claimed is:

1. A method for fabricating a semiconductor structure, the method comprising:
    forming a gate contact in contact with a gate stack;
    after forming the gate contact, removing a spacer surrounding at least a portion of the gate stack, wherein the removing forms a trench surrounding the gate stack and stopping at the gate contact; and
    depositing an insulating material within the trench to form an air gap spacer within the trench comprising at least three separate air gaps surrounded by the insulating material on corresponding sides of the gate stack.

2. The method of claim 1, wherein forming the gate contact comprises:
    forming the gate contact in contact with a portion of a top surface of a gate of the gate stack, and wrapping the gate contact around a portion of the gate and a portion of an underlying dielectric layer of the gate stack.

3. The method of claim 1, wherein forming the gate contact comprises:
    removing a portion of the spacer in contact with an end portion of the gate stack, wherein the removing exposes an end portion of a gate of the gate stack and an underlying dielectric layer, and further exposes sidewalls of the gate and underlying dielectric layer.

4. The method of claim 3, wherein forming the gate contact further comprises:
    removing a portion of a cap layer formed on the gate, the etching exposing a top surface of a gate at the end portion of the gate stack;
    removing a portion of an insulating layer adjacent to the gate stack; and
    forming the gate contact in contact with at least the top surface of the gate, the exposed sidewalls of the gate, and the exposed sidewalls of the underlying dielectric layer.

5. The method of claim 1, further comprising:
    prior to forming the gate contact,
        forming a source contact in contact with a portion of a source region of a substrate and a sidewall of the spacer; and
        forming a drain contact in contact with a portion of a drain region of the substrate and a sidewall of the spacer.

6. The method of claim 5, wherein forming the source contact and the drain contact comprises:
    depositing a dielectric material in contact with the source region, drain region, and spacer;
    forming a first contact trench adjacent to the spacer, the first contact trench exposing the portion of the source region;
    forming a second contact trench adjacent to the spacer, the second contact trench exposing the portion of the drain region; and
    filling the first contact trench and the second contact trench with a contact material;
    removing a portion of the first spacer at one end of the gate stack.

7. The method of claim 1, wherein forming the air gap spacer comprises:
    non-conformally depositing the insulating material within the trench, wherein the non-conformal deposition deposits a greater amount of the insulating material at a top portion of the trench than at a bottom portion of the trench, and wherein the non-conformal deposition forms an air gap between a top portion of the air gap spacer and a bottom portion of the air gap spacer.

8. The method of claim 1, further comprising forming the gate stack, wherein forming the gate stack comprises:
forming a replacement gate structure on a substrate; and
forming the spacer in contact with the replacement gate structure.

9. The method of claim 8, further comprising:
after forming the spacer, forming a source region and a drain region within the substrate.

10. The method of claim 8, further comprising:
after the spacer has been formed, selectively removing the replacement gate stack, wherein the selective removal exposes an active area within the substrate and sidewalls of the spacer;
forming a dielectric layer on and in contact with the active area; and
forming a conductive gate on and in contact with the dielectric layer.

11. A method for fabricating a semiconductor structure, the method comprising:
forming a plurality of gate contacts, wherein each gate contact of the plurality of gate contacts is in contact with a gate stack of a plurality of gate stacks;
after forming the plurality of gate contacts and for each gate stack of the plurality of gate stacks, removing a spacer surrounding at least a portion of the gate stack, wherein the removing forms a trench surrounding the gate stack and stopping at the gate contact; and
depositing, for each gate stack of the plurality of gate stacks, an insulating material within the trench to form an air gap spacer within each trench comprising at least three separate air gaps surrounded by the insulating material on corresponding sides of the gate stack.

12. The method of claim 11, wherein forming each gate contact of the plurality of gate contact comprises:
forming the gate contact in contact with a portion of a top surface of a gate of the gate stack, and wrapping the gate contact around a portion of the gate and a portion of an underlying dielectric layer of the gate stack.

13. The method of claim 11, wherein forming each gate contact of the plurality of gate contact comprises:
removing a portion of the spacer in contact with an end portion of the gate stack, wherein the removing exposes an end portion of a gate of the gate stack and an underlying dielectric layer, and further exposes sidewalls of the gate and underlying dielectric layer.

14. The method of claim 13, wherein forming each gate contact of the plurality of gate contact further comprises:
removing a portion of a cap layer formed on the gate, the etching exposing a top surface of a gate at the end portion of the gate stack;
removing a portion of an insulating layer adjacent to the gate stack; and
forming the gate contact in contact with at least the top surface of the gate, the exposed sidewalls of the gate, and the exposed sidewalls of the underlying dielectric layer.

15. The method of claim 11, further comprising:
prior to forming each gate contact of the plurality of gate contacts,
forming a plurality of source contacts, wherein each source contact is in contact with a portion of a source region of a substrate and a sidewall of one of the spacers; and
forming a plurality drain contacts, wherein each drain contact in contact with a portion of a drain region of the substrate and a sidewall of one of the spacers.

16. The method of claim 15, wherein forming each source contact of the plurality of source contacts and each drain contact of the plurality of drain contacts comprises:
depositing a dielectric material in contact with the source region, drain region, and spacer;
forming a first contact trench adjacent to the spacer, the first contact trench exposing the portion of the source region;
forming a second contact trench adjacent to the spacer, the second contact trench exposing the portion of the drain region; and
filling the first contact trench and the second contact trench with a contact material;
removing a portion of the first spacer at one end of the gate stack.

17. The method of claim 11, wherein forming the air gap spacer comprises:
non-conformally depositing the insulating material within the trench, wherein the non-conformal deposition deposits a greater amount of the insulating material at a top portion of the trench than at a bottom portion of the trench, and wherein the non-conformal deposition forms an air gap between a top portion of the air gap spacer and a bottom portion of the air gap spacer.

18. The method of claim 11, further comprising forming the plurality of gate stacks, wherein forming each gate stack in the plurality of gate stacks comprises:
forming a replacement gate structure on a substrate; and
forming the spacer in contact with the replacement gate structure.

19. The method of claim 18, further comprising:
after forming the spacer, forming a source region and a drain region within the substrate.

20. The method of claim 18, further comprising:
after the spacer has been formed, selectively removing the replacement gate stack, wherein the selective removal exposes an active area within the substrate and sidewalls of the spacer;
forming a dielectric layer on and in contact with the active area; and
forming a conductive gate on and in contact with the dielectric layer.

* * * * *